(12) United States Patent
Kim et al.

(10) Patent No.: US 10,831,294 B2
(45) Date of Patent: Nov. 10, 2020

(54) DISPLAY DEVICE INCLUDING A TOUCH SENSOR DISPOSED ON A DISPLAY PANEL

(71) Applicant: Samsung Display Co., Ltd., Yongin-si (KR)

(72) Inventors: Jae Neung Kim, Seoul (KR); Do Hyun Kwon, Seongnam-si (KR); Chang Yong Jung, Seoul (KR); Choong Youl Im, Yongin-si (KR)

(73) Assignee: Samsung Display Co., Ltd. (KR)

( * ) Notice: Subject to any disclaimer, the term of this patent is extended or adjusted under 35 U.S.C. 154(b) by 34 days.

(21) Appl. No.: 15/969,238

(22) Filed: May 2, 2018

(65) Prior Publication Data

US 2019/0114011 A1    Apr. 18, 2019

(30) Foreign Application Priority Data

Oct. 16, 2017   (KR) ........................ 10-2017-0134070

(51) Int. Cl.
| | |
|---|---|
| *G06F 3/041* | (2006.01) |
| *G06F 3/044* | (2006.01) |
| *H01L 27/32* | (2006.01) |
| *H01L 51/50* | (2006.01) |
| *H01L 51/52* | (2006.01) |

(52) U.S. Cl.
CPC ............ *G06F 3/0412* (2013.01); *G06F 3/044* (2013.01); *H01L 27/323* (2013.01); *H01L 27/3246* (2013.01); *H01L 51/5012* (2013.01); *H01L 51/5203* (2013.01); *H01L 51/5237* (2013.01); *H01L 27/3272* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2013/0229364 A1* | 9/2013 | Yu ........................... | G06F 3/044 345/173 |
| 2014/0232950 A1* | 8/2014 | Park ....................... | G06F 3/044 349/12 |
| 2015/0022741 A1* | 1/2015 | Nii ........................ | G06F 3/0416 349/12 |

(Continued)

FOREIGN PATENT DOCUMENTS

| | | |
|---|---|---|
| KR | 10-1481674 | 1/2015 |
| KR | 10-2015-0019157 A | 2/2015 |

(Continued)

*Primary Examiner* — Kent W Chang
*Assistant Examiner* — Benjamin Morales
(74) *Attorney, Agent, or Firm* — Innovation Counsel LLP

(57) ABSTRACT

A display device according to an exemplary embodiment includes: a display panel that displays an image; and a touch sensor that is provided on the display panel, wherein the touch sensor includes a sense electrode that senses a touch and a shield layer that is disposed between the sense electrode and the display panel while partially overlapping the sense electrode, the sense electrode includes a plurality of conductive lines that are connected with each other and have a mesh shape, the plurality of conductive lines includes a first conductive line and a second conductive line that are disposed on different layers, and the shield layer overlaps at least one of the first conductive line and the second conductive line.

18 Claims, 12 Drawing Sheets

(56) References Cited

U.S. PATENT DOCUMENTS

2016/0378224 A1* 12/2016 Kwon ................ H01L 51/5256
  345/174
2018/0239457 A1* 8/2018 He .......................... G06F 3/044

FOREIGN PATENT DOCUMENTS

| KR | 10-2017-0026026 A | 3/2017 |
| KR | 10-2017-0070335 A | 6/2017 |
| KR | 10-1744784 | 6/2017 |

* cited by examiner

DISPLAY DEVICE INCLUDING A TOUCH SENSOR DISPOSED ON A DISPLAY PANEL

CROSS-REFERENCE TO RELATED APPLICATION

This application claims priority to and the benefit of Korean Patent Application No. 10-2017-0134070 filed in the Korean Intellectual Property Office on Oct. 16, 2017, the entire contents of which are incorporated herein by reference.

BACKGROUND

1. Field

The present disclosure relates to a display device. More particularly, the present disclosure relates to a display device that includes a touch sensor.

2. Description of the Related Art

As an input device of a display device, a touch sensor through which a user inputs information by contacting a screen using a finger or a pen has been applied. Among many sensing methods of the touch sensor, a capacitive type of method in which a location where capacitance is changed according to a contact in two separated electrodes has been used.

In order to implement a flexible display device, the display device needs to be slim, so the touch sensor is embedded in the display device. Such an embedded type of touch sensor does not include its own substrate, and sense electrodes are directly formed on one of constituent elements of the display device.

The above information disclosed in this Background section is only for enhancement of understanding of the background of the disclosure and therefore it may contain information that does not form the prior art that is already known in this country to a person of ordinary skill in the art.

SUMMARY

Exemplary embodiments have been made in an effort to provide a display device that can improve touch sensitivity.

A display device according to an exemplary embodiment includes: a display panel configured to display an image; and a touch sensor that is provided on the display panel, wherein the touch sensor includes a sense electrode that senses a touch and a shield layer that is disposed between the sense electrode and the display panel while partially overlapping the sense electrode, the sense electrode includes a plurality of conductive lines that are connected with each other and have a mesh shape, the plurality of conductive lines includes a first conductive line and a second conductive line that are disposed on different layers, and the shield layer overlaps at least one of the first conductive line and the second conductive line.

The first conductive line may be provided on the second conductive line, and the shield layer may partially overlap the first conductive line.

The touch sensor may further include: a first insulation layer that is provided on the display panel and a second insulation layer that is provided on the first insulation layer, the second conductive line may be provided between the first insulation layer and the second insulation layer, the first conductive line may be disposed on the second insulation layer, and the shield layer may be disposed on the same layer as the second conductive line.

The second insulation layer may include an organic material.

The display device may further include a light blocking layer that is disposed on the touch sensor, wherein the shield layer may overlap the light blocking layer.

The display panel may include: a substrate; a light emitting member that is disposed on the substrate; and a thin film encapsulation layer that covers the light emitting member, wherein the light emitting member may include a plurality of light emitting diodes configured to emit light and a pixel defining layer that separates the plurality of organic light emitting diodes from each other, the shield layer overlaps the pixel defining layer.

The light blocking layer may overlap the pixel defining layer.

The plurality of conductive lines may be connected with each other and have a mesh shape.

The shield layer may correspond to the first conductive line on a plane and may have a mesh shape.

A width of the shield layer may be greater than that of the first conductive line and smaller than that of the light blocking layer.

The shield layer may have an island shape on a plane.

The display panel may include a display area and a peripheral area that is provided outside the display area, the touch sensor may further include connection wires that are connected with the sense electrode and disposed in the peripheral area, and the display device may further include a peripheral shield layer that is provided between the connection wire and the display panel.

The connection wire may include the first conductive line in plural, and the peripheral shield layer may be disposed between the first insulation layer and the second insulation layer.

The peripheral shield layer may be disposed below the first conductive lines and a second insulation layer between neighboring first conductive lines.

Further, a display device according to an exemplary embodiment includes: a display panel configured to display an image; and a touch sensor that is disposed on the display panel, wherein the touch sensor includes a sense electrode that senses a touch, and a shield layer that is disposed between the sense electrode and the display panel, the sense electrode includes a first sense electrode and a second sense electrode that are disposed apart from each other on a plane, and the shield layer overlaps at least one of the first sense electrode and the second sense electrode.

The first sense electrode may include a plurality of first sense cells and plurality of first connection portions that connect the plurality of first sense cells to each other, the second sense electrode may include a plurality of second sense cells and a plurality of second connection portions that connect the plurality of second sense cells to each other, and the shield layer may be disposed on the same layer as the first connection portion.

The shield layer may be disposed on a layer that is different from the layer where the first sense cells, the second sense cells, and the second connection portions are disposed.

According to the exemplary embodiments, touch sensitivity can be improved. In addition, noise generated during driving of the display panel can be minimized.

Further, impact resistance of the touch sensor and a display device including the same can be reinforced.

DETAILED DESCRIPTION OF THE EMBODIMENTS

Figure 1:
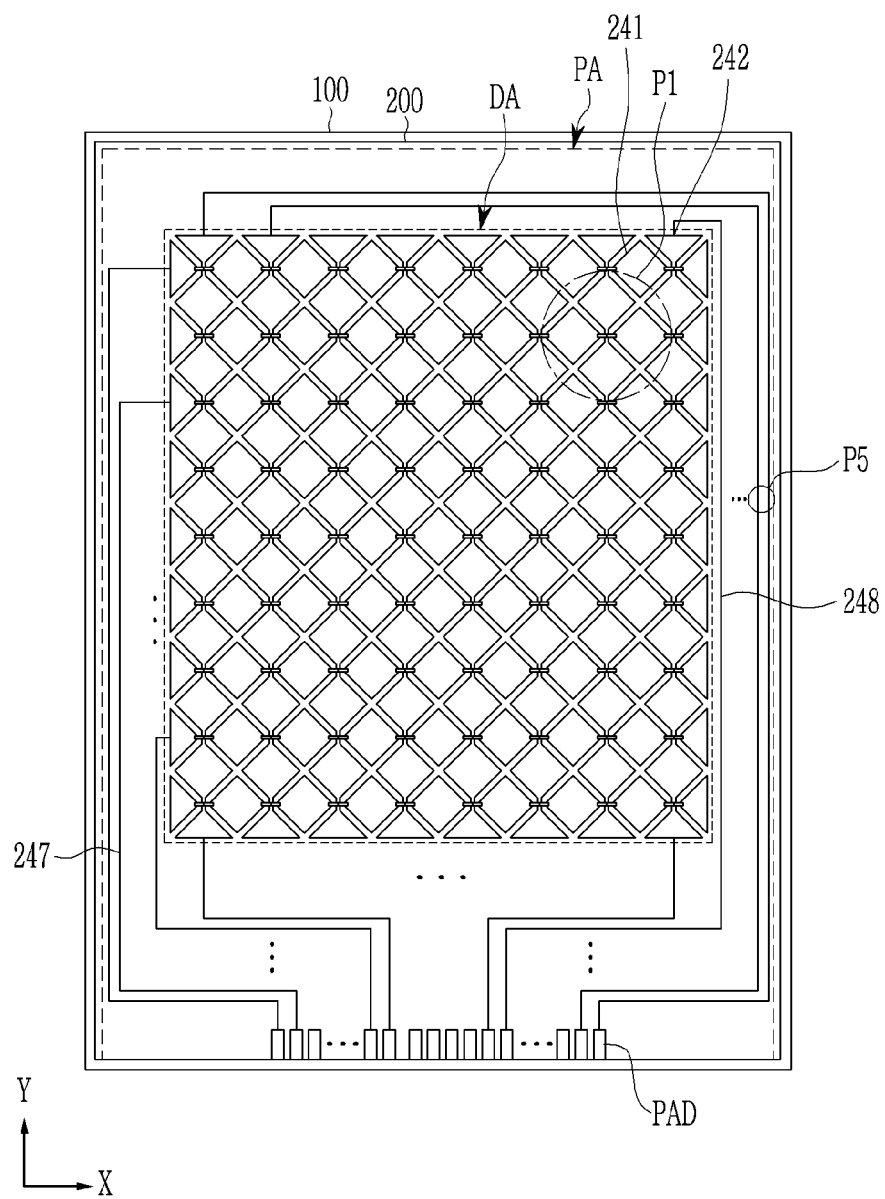
FIG. 1 is a schematic top plan view of a display device according to an exemplary embodiment.

Hereinafter, the present disclosure will be described more fully with reference to the accompanying drawings, in which exemplary embodiments of the disclosure are shown. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the present disclosure is not limited thereto. In the drawings, the thickness of layers, films, panels, regions, etc., are exaggerated for clarity. In addition, in the drawings, the thickness of layers and regions may be partially exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In this specification, the phrase "on a plane" means viewing a target portion from the top, and the phrase "on a cross-section" means viewing a cross-section formed by vertically cutting a target portion from the side.

Hereinafter, a display device according to an exemplary embodiment will be described with reference to the accompanying drawings.

Figure 2:
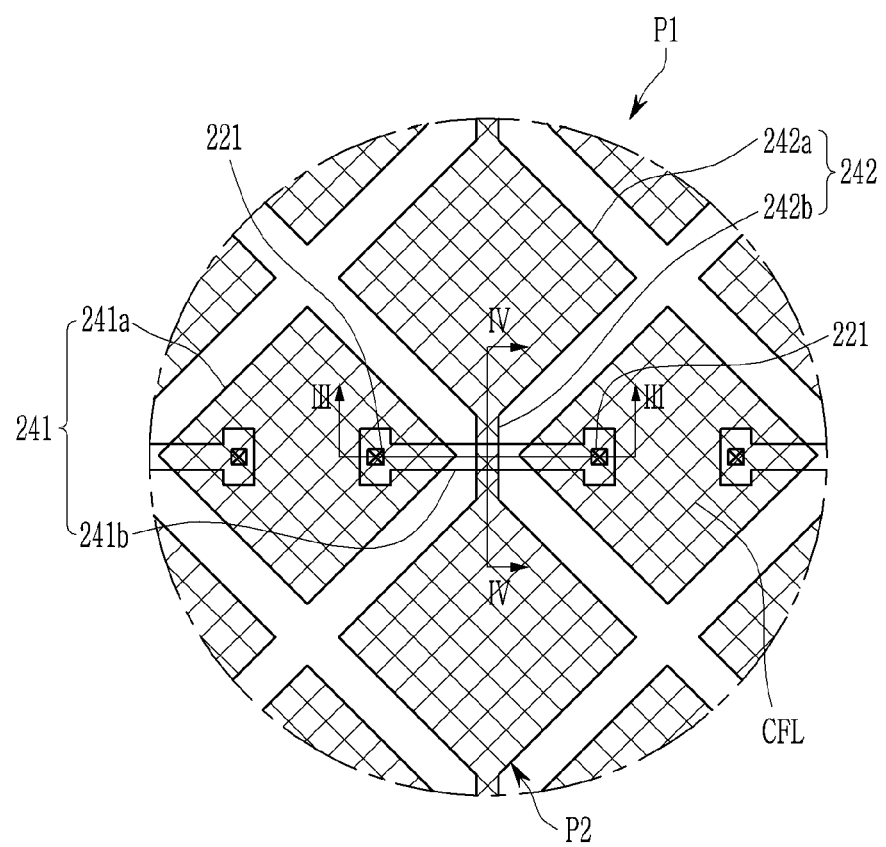
FIG. 2 is an enlarged top plan view of a portion P1 in FIG. 1.
Figure 3:
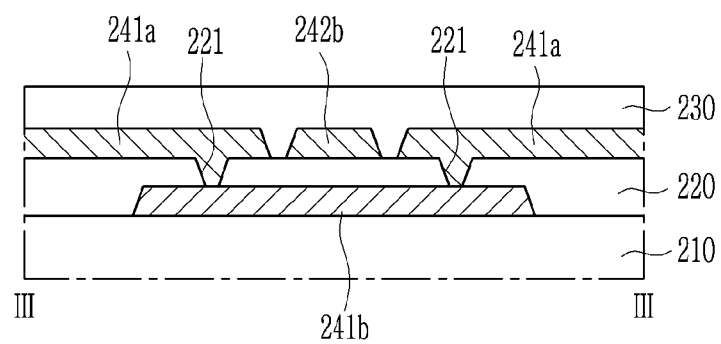
FIG. 3 is a partial cross-sectional view of FIG. 2, taken along the line III-III.
Figure 4:
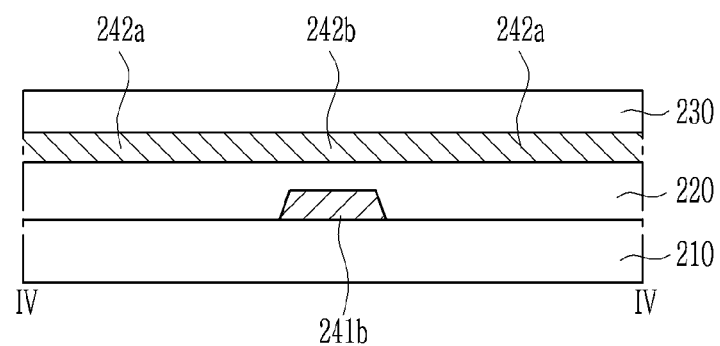
FIG. 4 is a partial cross-sectional view of FIG. 2, taken along the line IV-IV.

FIG. 1 is a schematic top plan view of a display device according to an exemplary embodiment, FIG. 2 is a partially enlarged view of a portion P1 in FIG. 1, FIG. 3 is a partial cross-sectional view of FIG. 2, taken along the line III-III, and FIG. 4 is a partial cross-sectional view of FIG. 2, taken along the line IV-IV.

As shown in FIG. 1, a display device according to an exemplary embodiment includes a display panel 100 that displays an image and a touch sensor 200 that is disposed on the display panel 100. The display panel 100 may be an organic light emitting display device. However, the present disclosure is not limited thereto, and the display panel 100 may be various other types of display devices, e.g., an LCD.

The display panel 100 may include a display area DA, and a peripheral area PA that is an area outside of the display area DA. The display area DA may include a plurality of pixels, and an image may be output in the display area DA. The peripheral area PA may be disposed at one side of the display area DA. In FIG. 1, the peripheral area PA surrounds the display area DA, but the alignment of the display area DA and the peripheral PA is not limited thereto. Thus, the alignment of the display area DA and the peripheral area PA may be changed as necessary.

The touch sensor 200 may include sense electrodes 241 and 242 that are disposed in the display area DA, and connection wires 247 and 248 that are disposed in the peripheral area PA. In the present exemplary embodiment, the sense electrodes 241 and 242 are disposed in the display area DA, but this is not restrictive, and the sense electrodes 241 and 242 may extend to the peripheral area PA. In this case, the sense electrode may be utilized as a control portion for controlling the display device.

The sense electrodes 241 and 242 may include a first sense electrode 241 that extends in a first direction X, and a second sense electrode 242 that extends in a second direction Y that crosses the first direction X. The connection wires 247 and 248 may include a first connection wire 247 that is connected with the first sense electrode 241, and a second connection wire 248 that is connected with the second sense electrode 242.

In this case, the first sense electrode 241 and the second sense electrode 242 may sense touch of a user using a capacitive type method, and a method for sensing the user's touch may include a mutual-capacitive type of method or a self-capacitive type of method.

As shown in FIG. 2, the first sense electrode 241 may include a plurality of first sense cells 241a, each substantially having a shape of a rhombus, and a plurality of first connection portions 241b that extend in the first direction X and connect the plurality of first sense cells 241a. The first sense electrode 241 may be a transmitter (Tx) touch electrode to which a first touch signal for sensing a coordinate value in the second direction Y is transmitted.

The second sense electrode 242 may include a plurality of second sense cells 242a, each substantially having a shape of a rhombus, and a plurality of connection portions 242b that extend in the second direction Y and connect the plurality of second sense cells 242a. The second sense electrode 242 may be a receiver (Rx) touch electrode to which a second touch signal for sensing a coordinate value in the first direction X is transmitted. In the present exemplary embodiment, the first sense cell 241a and the second sense cell 242a are formed in the shape of a rhombus, but this is not restrictive. They may have various shapes. Further, in the present exemplary embodiment, the first sense electrode 241 is the Tx touch electrode and the second sense electrode 242 is the Rx touch electrode, but this is not restrictive. The first sense electrode 241 may be the Rx touch electrode and the second sense electrode 242 may be the Tx touch electrode.

The first sense electrode 241 and the second sense electrode 242 may be connected to a pad portion PAD respectively through the first connection wire 247 and the second connection wire 248. The pad portion PAD is connected to a controller (not shown) to transmit a first touch signal and a second touch signal to the sense electrodes 241 and 242.

The first sense electrode 241 and the second sense electrode 242 are disposed apart from each other by as much as a predetermined interval, and capacitance may be formed between the first sense electrode 241 and the second sense electrode 242. When a touch is made by a user, the capacitance formed between the first sense electrode 241 and the second sense electrode 242, is changed and the controller (not shown) may sense a touch location by recognizing the change of the capacitance.

On a plane view, the first sense cells 241a and the second sense cells 242a neighbor each other, and the first connection portions 241b and the second connection portions 242b cross each other but they may be insulated from each other by a second insulation layer 220.

The first sense cells 241a, the second sense cells 242a, and the second connection portions 242b may be disposed on the same layer. In addition, the first connection portions 241 may be disposed on a layer other than the layer where the first connection portions 241b, the first sense cells 241a, and the second sense cells 242a are disposed. Specifically, the first connection portion 241b may be disposed below the first sense cells 241a and the second sense cells 242a, and the second connection portion 242b. The first connection portions 241b are disposed on a first insulation layer 210. The first insulation layer 210 may be disposed between the first connection portions 241b and the display panel 100. In addition, the second insulation layer 220 is disposed above the first connection portions 241b, and the second insulation layer 220 may have a contact hole 221 that overlaps the first connection portion 241b. The first sense cells 241a, the second sense cells 242a, and the second connection portion 242b may be disposed on the second insulation layer 220. The first sense cell 241a may be connected with the first connection portion 241b through the contact hole 221.

The second sense cells 242a and the second connection portion 242b of the second sense electrode 242 may be integrally formed. Thus, the first sense cell 241a, the second sense cell 242a, and the second connection portion 242b may be simultaneously formed through the same process. However, the second connection portion 242b is not necessarily simultaneously formed with the first sense cell 241a and the second sense cell 242a, and may be separately formed in another process by using a different material.

In addition, in the present exemplary embodiment, the first connection portion 241b is disposed in a layer other than the layer where the first sense cell 241a, the second sense cell 242a, and the second connection portion 242b are disposed, but this is not restrictive. The second connection portion 242b may be disposed in a layer other than a layer where the first sense cell 241a, the second sense cell 242a, and the first connection portion 241b are disposed.

The sense electrodes 241 and 242 may include a low-resistive material such as silver (Ag), aluminum (Al), copper (Cu), chromium (Cr), nickel (Ni), and the like, or a conductive nanomaterial such as a silver nanowire, a carbon nanotube, and the like. The sense electrodes 241 and 242 have low resistance so that RC delay can be reduced, and have excellent flexibility so that cracks are not easily formed even after iterative deformation such as bending occurs.

The first insulation layer 210 and the second insulation layer 220 may include an inorganic material. In this case, the inorganic material may include any one selected from an aluminum oxide, a titanium oxide, a silicon oxide, a silicon oxynitride, a zirconium oxide, a hafnium oxide, and a combination thereof.

However, the material of the first insulation layer 210 and the second insulation layer 220 is not limited thereto, and they may include an organic material. In this case, the organic material may include any one selected from an acrylic resin, a methacrylic resin, a polyisoprene, a vinyl resin, an epoxy resin, a urethane resin, a cellulose resin, a siloxane resin, a polyimide resin, a polyamide resin, a perylene resin, and a combination thereof.

The touch sensor 200 may be formed in the shape of a mesh. That is, the sense electrodes 241 and 242 and the connection wires 247 and 248 may include a plurality of conductive lines CFL. In FIG. 2, it is described that the sense electrodes 241 and 242 are formed of the plurality of conductive lines CFL, but the conductive lines CFL are not shown in detail in FIG. 3 and FIG. 4 for better understanding and ease of description.

As described, since the sense electrodes 241 and 242 are formed of the plurality of conductive lines CFL, thereby forming the mesh format, light emitted from the display panel 100 is not blocked, and the area overlapping the conductive lines CFL of the display panel 100 can be reduced, thereby minimizing parasitic capacitance.

In addition, the touch sensor 200 uses the display panel 100 as a support plate rather than using its own support plate. Thus, the entire thickness of the touch sensor 200 becomes very slim so that it is advantageous to manufacture a thin display device, and is appropriate for a flexible display device.

Figure 5:
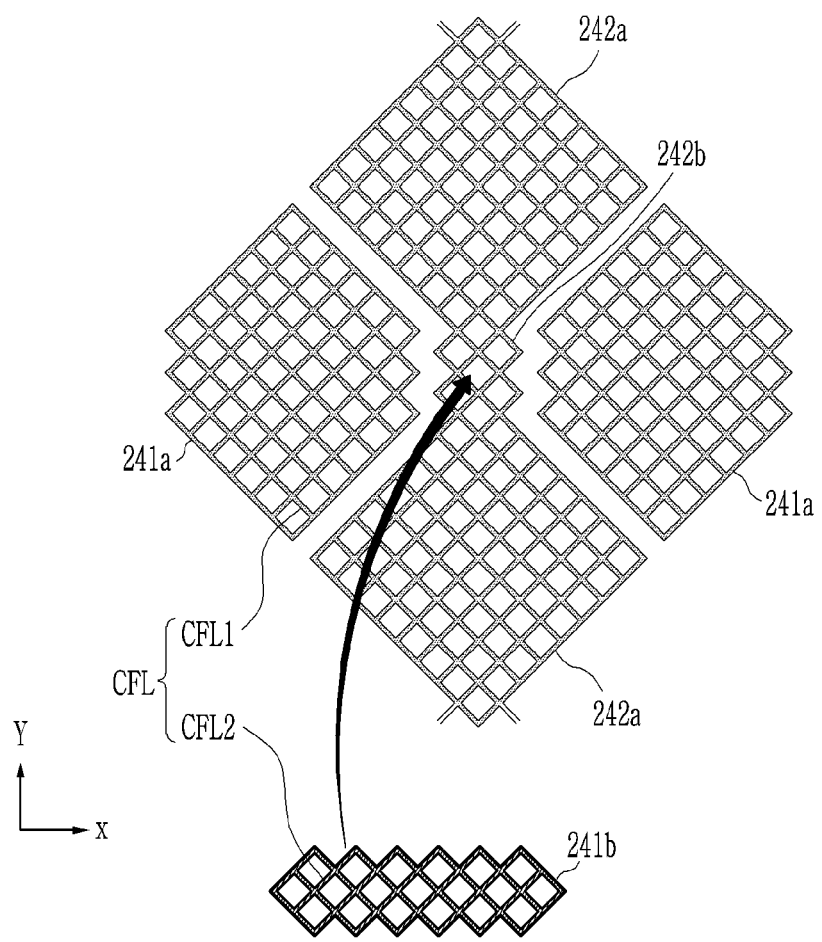
FIG. 5 is an enlarged top plan view of a portion P2 in FIG. 2, and first sense cells, second sense cells, a second connection portion, and first connection portions that are disposed therebelow are separately shown.
Figure 6:
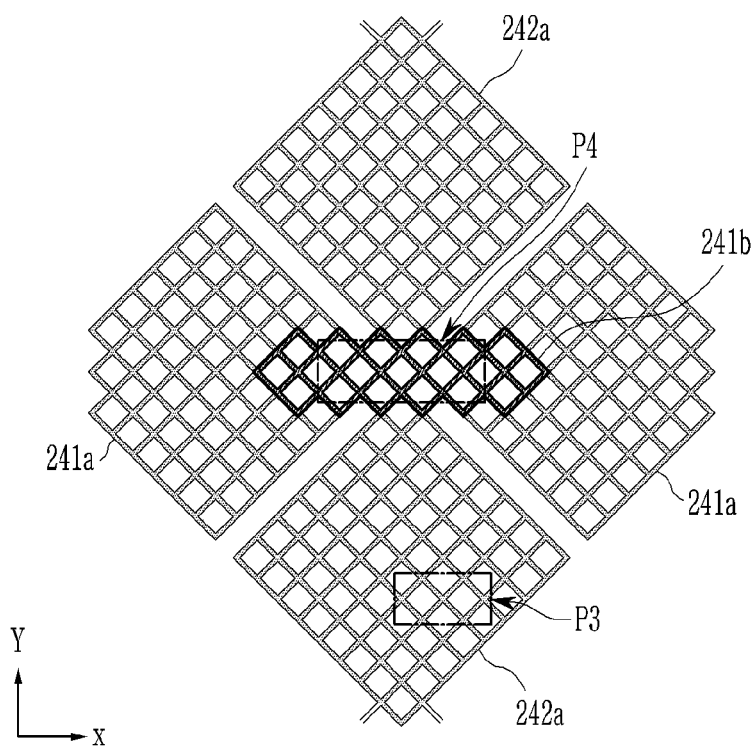
FIG. 6 is an enlarged top plan view of the portion P2 in FIG. 2.
Figure 7:
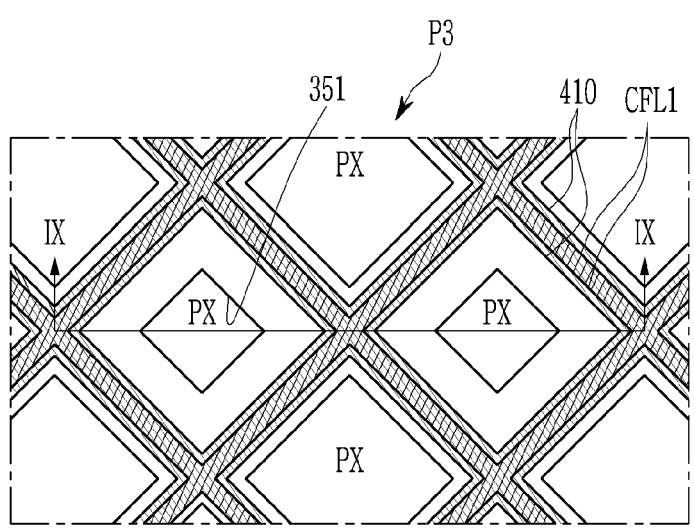
FIG. 7 is an enlarged top plan view of a portion P3 in FIG. 6, and schematically illustrates first conductive lines and a shield layer.
Figure 8:
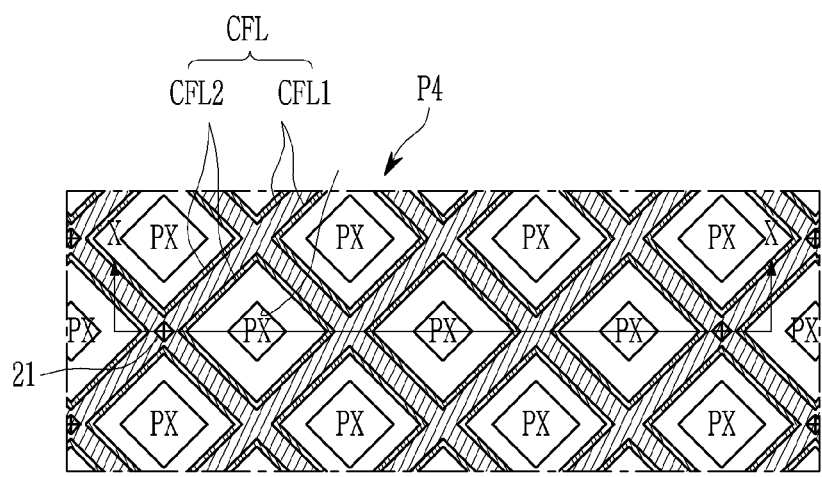
FIG. 8 is an enlarged top plan view of a portion P4 in FIG. 6, and schematically illustrates first conductive lines and second conductive lines.
Figure 9:
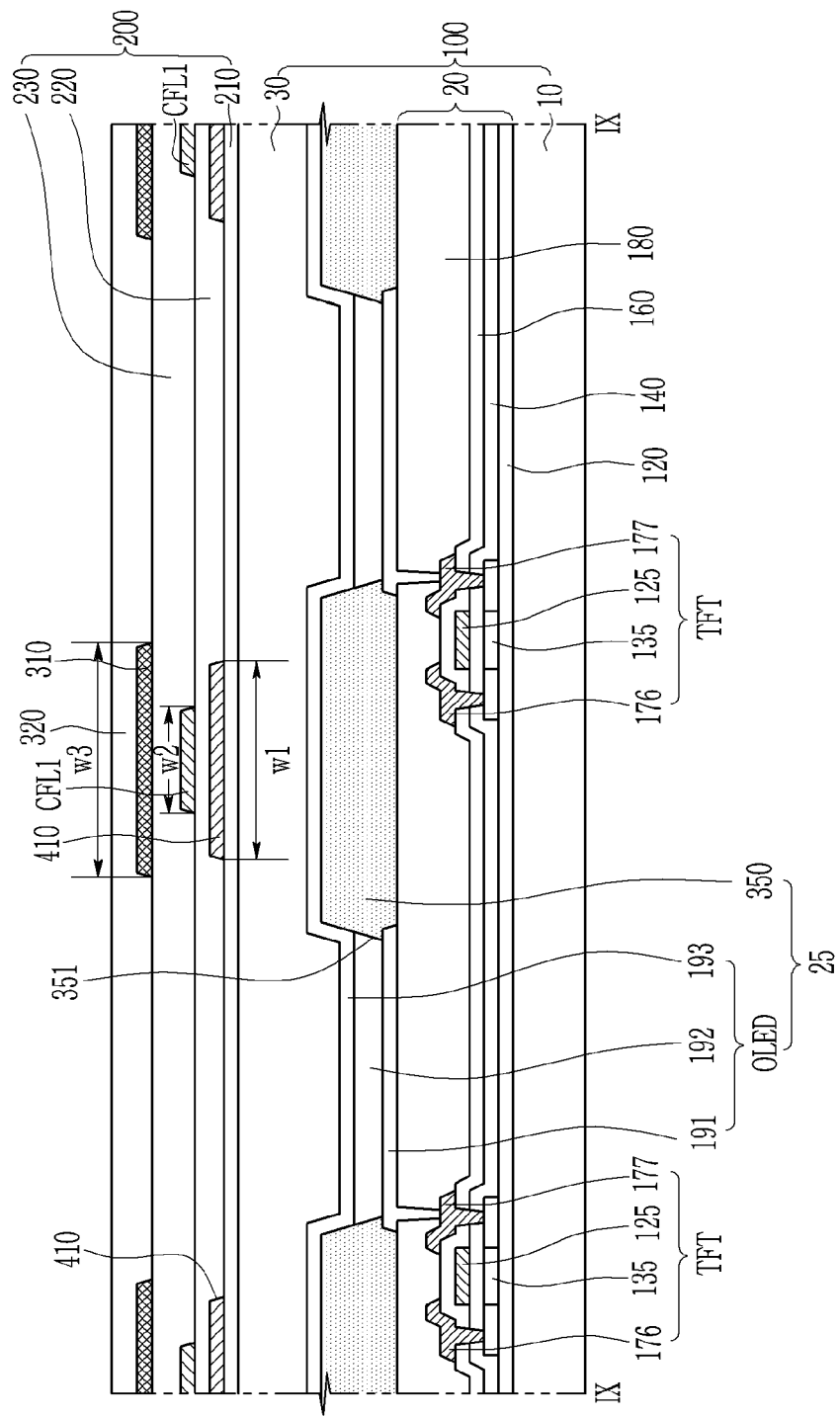
FIG. 9 is a cross-sectional view of FIG. 7, taken along the line IX-IX.
Figure 10:
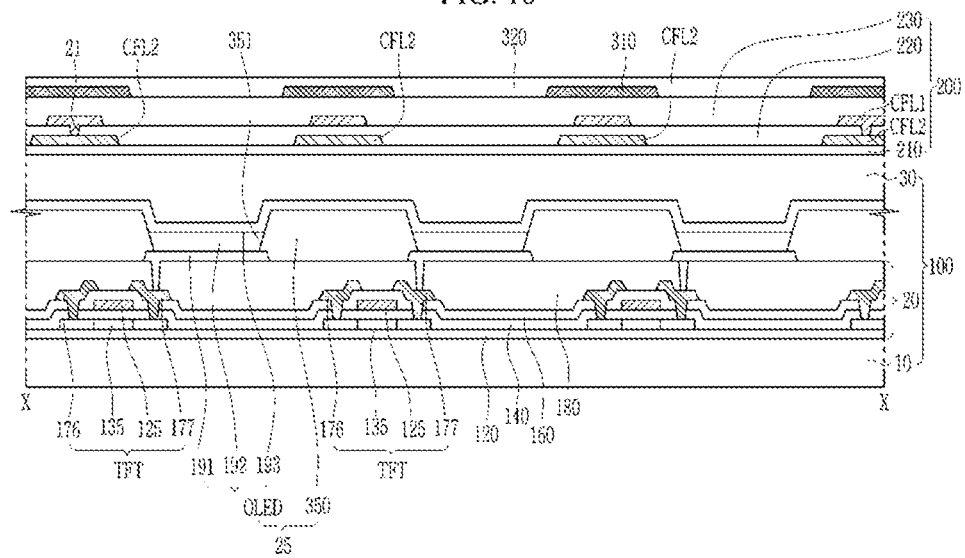
FIG. 10 is a cross-sectional view of FIG. 8, taken along the line X-X.

FIG. 5 is an enlarged top plan view of a portion P2 in FIG. 2, and first sense cells, second sense cells, a second connection portion, and first connection portions that is disposed therebelow are separately shown, while FIG. 6 is an enlarged top plan view of the portion P2 in FIG. 2. FIG. 7 is an enlarged top plan view of a portion P3 in FIG. 6, and schematically illustrates first conductive lines and a shield layer, while FIG. 8 is an enlarged top plan view of a portion P4 in FIG. 6, and schematically illustrates first conductive lines and second conductive lines. FIG. 9 is a cross-sectional view of FIG. 7, taken along the line IX-IX, and FIG. 10 is a cross-sectional view of FIG. 8, taken along the line X-X.

As shown in FIG. 5 and FIG. 6, the first sense electrode 241 and the second sense electrode 242 may include the plurality of conductive lines CFL that form a mesh shape. The plurality of conductive lines CFL may include first conductive lines CFL1 and second conductive lines CFL2 that are respectively disposed on different layers.

Specifically, first sense cells 241a, second sense cells 242a, and second connection portion 242b that are disposed on the same layer may include a plurality of first conductive lines CFL1. In addition, first connection portions 241b that are disposed below the first sense cells 241a and the second connection portion 242b while overlapping the same may include a plurality of second conductive lines CFL2.

Hereinafter, a lamination structure of a display device according to an exemplary embodiment will be described with reference to FIG. 7 to FIG. 10.

As shown in FIG. 7 to FIG. 10, a display device according to the present exemplary embodiment includes a display panel 100 and a touch sensor 200 that is disposed on the display panel 100.

The display panel 100 may include a substrate 10, a switch 20 that is disposed on the substrate 10, a light emitting member 25 that is disposed on the switch 20, and a thin film encapsulation layer 30 that covers the light emitting member 25. In this case, the touch sensor 200 may be formed directly above the thin film encapsulation layer 30.

The substrate 10 may be an insulation substrate made of glass, quartz, ceramic, plastic, and the like, or a metallic substrate made of stainless steel and the like.

The switch 20 may include a buffer layer 120, a semiconductor 135, a gate insulation layer 140, a gate electrode 125, an interlayer insulation layer 160, a source electrode 176, a drain electrode 177, and a planarization layer 180, which are sequentially laminated on the substrate 10. However, the switch 20 is not limited thereto, and may be variously modified.

The buffer layer 120 improves a characteristic of polysilicon by blocking an impurity from the substrate 10 during a crystallization process for forming polysilicon. In addition, the buffer layer 120 planarizes the substrate 10 to alleviate the stress applied to the semiconductor 135 that is formed on the buffer layer 120. Such a buffer layer 120 may be made of a silicon nitride (SiNx) or a silicon oxide ($SiO_x$).

The semiconductor 135 may be disposed on the buffer layer 120 of the display area DA. The semiconductor 135 may be made of a polysilicon or an oxide semiconductor. The semiconductor 135 includes a channel region, a source region, and a drain region. The source region and the drain region are disposed at opposite sides of the channel region and doped with an impurity. The gate insulation layer 140 may be disposed on the semiconductor 135, and the gate electrode 125 may be disposed on the gate insulation layer 140. The gate electrode 125 overlaps the channel region of the semiconductor 135. The gate insulation layer 140 may be made of a silicon nitride (SiNx) or a silicon oxide ($SiO_x$).

The interlayer insulation layer 160 may be disposed on the gate electrode 125, and the source electrode 176 and the drain electrode 177 may be disposed on the interlayer insulation layer 160. The source electrode 176 and the drain electrode 177 are respectively connected with the source region and the drain region of the semiconductor 135 through contact holes formed in the interlayer insulation layer 160 and the gate insulation layer 140. A thin film transistor TFT shown in FIG. 9 is a driving thin film transistor, and may be covered by the planarization layer 180.

The light emitting member 25 may include organic light emitting diodes that are provided on the planarization layer 180, and a pixel defining layer 350 that separates neighboring organic light emitting diodes OLED.

The organic light emitting diodes OLED may include a first electrode 191, an emission layer 192, and a second electrode 193, which are sequentially disposed on the planarization layer 180.

Specifically, the first electrode 191 is disposed on the planarization layer 180. A first electrode 191 is provided in each pixel, and is connected with a drain electrode 177 of the driving thin film transistor TFT through a via hole formed in the planarization layer 180. The pixel defining layer 350 is disposed on the planarization layer 180 and the first electrode 191.

The pixel defining layer 350 forms an opening 351 to expose a center portion of the first electrode 191, in which the emission layer 192 is formed.

The emission layer 192 is disposed on the first electrode 191, and the second electrode 193 is disposed on the emission layer 192 and the pixel defining layer 350.

The second electrode 193 is formed throughout the display panel 100 without distinction for each pixel. Any one of the first electrode 191 and the second electrode 193 injects holes to the emission layer 192, and the other injects electrons to the emission layer 192. The electron and the hole are combined with each other in the emission layer 192 to generate an exciton, and light is emitted by energy generated when the exciton falls from an excited state to a ground state. The first electrode 191, the emission layer 192, and the second electrode 193 form the organic light emitting diode OLED. The first electrode 191 may be provided as a reflective layer, and the second electrode 193 may be provided as a transparent layer or a semi-transparent layer. Light emitted from the emission layer 192 is reflected in the first electrode 191, and then emitted to the outside through the second electrode 193. In this case, when the second electrode 193 is provided as a semi-transparent layer, light reflected in the first electrode 191 is partially re-reflected in the second electrode 193 such that a resonance structure is formed, thereby improving light extraction efficiency.

The thin film encapsulation layer 30 is formed on the second electrode 193 to cover the second electrode 193.

Since the organic light emitting diode OLED is vulnerable to moisture and oxygen, the thin film encapsulation layer 30 seals the organic light emitting diode OLED to prevent permeation of external moisture and oxygen. The thin film encapsulation layer 30 may have a multi-layered structure of an inorganic layer and an organic layer. The inorganic layer may include at least one of $Al_2O$, SiNx, and $SiO_x$. The organic layer may include at least one of epoxy, acrylate, and urethane acrylate. Such a thin film encapsulation layer 30 has a very thin thickness so that it is advantageous in facilitation of a reduction in thickness, and is appropriate for a flexible display device.

Since the thin film encapsulation layer 30 includes the organic layer, it can be planarized. The touch sensor 200 is provided on the planarized thin film encapsulation layer 30.

FIG. 9 is a cross-sectional view of the second sense cell 242a of FIG. 6, taken along the line IX-LX in the portion P3 of FIG. 7, and only illustrates the first conductive line CFL1 of the second sense cell 242a for better understanding and ease of description. In addition, FIG. 10 is a cross-sectional view of FIG. 6, taken along the line X-X in the portion P4 of FIG. 8, and only illustrates the second conductive line CFL2 of the first connection portion 241b and the first conductive line CFL1 of the second connection portion 242b for better understanding and ease of description.

Specifically, as shown in FIG. 9 and FIG. 10, the touch sensor 200 may include the first insulation layer 210 that is disposed on the thin film encapsulation layer 30, the second conductive line CFL2 that is disposed on the first insulation layer 210, the second insulation layer 220 that covers the second conductive line CFL2, the first conductive line CFL1 that is disposed on the second insulation layer 220, and a third insulation layer 230 that covers the second insulation layer 220 and the first conductive line CFL1. The second conductive line CFL2 is connected with the first conductive line CFL1 through a contact hole 21 formed in the second insulation layer 220.

Here, the plurality of second conductive lines CFL2 form the first connection portion 241b, and the plurality of first conductive lines CFL1 form the first sense cell 241a, the second sense cell 242a, and the second connection portion 242b.

In addition, a light blocking layer 310 is disposed on the third insulation layer 230. The light blocking layer 310 is disposed corresponding to the conductive lines CFL. Such a light blocking layer 310 is covered by an overcoat 320. The overcoat 320 planarizes the light blocking layer 310 by covering the same. The overcoat 320 may include an organic material. In this case, the organic material may include any one selected from an acrylic resin, a methacrylic resin, a polyisoprene, a vinyl resin, an epoxy resin, a urethane resin, a cellulose resin, a siloxane resin, a polyimide resin, a polyamide resin, a perylene resin, and a combination thereof.

The light blocking layer 310 may not overlap the opening 351 of the pixel defining layer 350, and may be formed in the shape of a mesh that substantially surrounds the plurality of pixels PX. Each pixel PX is one light emission unit, and corresponds to an organic light emitting diode OLED. In this case, the area of the organic light emitting diode OLED may be defined as an area where light is emitted through the opening 351 of the pixel defining layer 350. Thus, the area of each pixel PX may be substantially equal to the area of the organic light emitting diode OLED.

Since the light blocking layer 310 that partially covers the second electrode 193 by overlapping the pixel defining layer 350 is formed, reflection of external light in the second electrode 193 can be minimized. Thus, reflection of external light and color sense of the display panel 100 can be improved.

As shown in FIG. 7 and FIG. 9, a shield layer 410 may be disposed on the first insulation layer 210. That is, the shield layer 410 may be disposed on the same layer as the second conductive line CFL2. Such a shield layer 410 may overlap some of the plurality of first conductive lines CFL1. That is, the shield layer 410 does not overlap first conductive lines CFL1 that overlap the second conductive lines CFL2 among the plurality of first conductive lines CFL1. A width w1 of the shield layer 410 may be greater than a width w2 of the first conductive layer CFL1 and smaller than a width w3 of the light blocking layer 310.

When the width w1 of the shield layer 410 is greater than the width w2 of the first conductive line CFL1, noise can be effectively removed, and when the width w1 of the shield layer 410 is smaller than the width w3 of the light blocking layer 310, a decrease of an aperture ratio can be prevented.

The shield layer 410 may be made of the same material as that of the first conductive line CFL1. That is, the shield layer 410 may include molybdenum, silver, titanium, copper, aluminum, and an alloy thereof, and may have a three-layered structure of titanium/aluminum/titanium.

The shield layer 410 may overlap the pixel defining layer 350, and may have a mesh shape like the shield layer 410 on a plane.

As shown in FIG. 7, the shield layer 410 is disposed corresponding to the first conductive line CFL1 on a plane, and may have a mesh shape.

Such a shield layer 410 can block parasitic capacitance between the light emitting member 25 and the touch sensor 200 so that touch sensitivity can be improved. In addition, the shield layer 410 can block noise that is not removed in the second electrode 193 of the light emitting member 25 among noise generated from driving of the display panel 100, thereby minimizing noise.

Further, since the shield layer 410 is entirely formed in the shape of a mesh under the first conductive line CFL1, impact resistance of the touch sensor 200 and the display device that includes the same can be reinforced.

In the exemplary embodiment shown in FIG. 1 to FIG. 10, the shield layer 410 has a mesh shape, but the shield layer 410 may have an island shape in another exemplary embodiment.

Hereinafter, a display device according to another exemplary embodiment will be described in detail with reference to FIG. 11.

Figure 11:
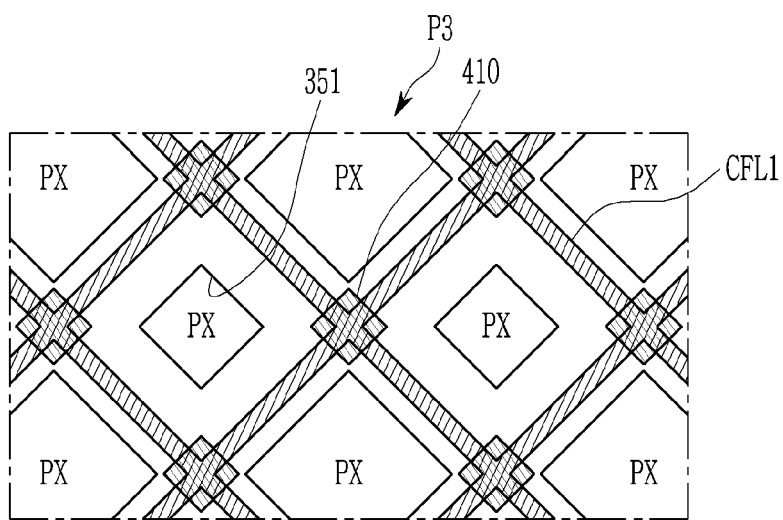
FIG. 11 is an enlarged top plan view of a display device according to another exemplary embodiment, and corresponds to the portion P3 in FIG. 6.

FIG. 11 is an enlarged top plan view of a display device according to another exemplary embodiment, and corresponds to the portion P3 in FIG. 6.

The exemplary embodiment shown in FIG. 11 is substantially the same as the exemplary embodiment shown in FIG. 1 to FIG. 11, except for a structure of a shield layer on a plane, and therefore a duplicated description will be omitted.

As shown in FIG. 11, a shield layer 410 of a touch sensor of a display device according to another exemplary embodiment may partially overlap a plurality of first conductive lines CFL1. Such a shield layer 410 may have an island shape on a plane.

The shield layer 410 can block parasitic capacitance between a light emitting member 25 and a touch sensor 200 so that touch sensitivity can be improved. In addition, the shield layer 410 can block noise that is not blocked in a second electrode 193 of the light emitting member 25 among noise generated during driving of a display panel 100, thereby minimizing noise.

In addition, since the shield layer 410 disposed below the first conductive lines CFL1 has the island shape on a plane, impact resistance of the touch sensor 200 and a display device including the same can be reinforced.

Meanwhile, the shield layer 410 is disposed below the first conductive line CFL1 of the sense electrode disposed in the display area in the exemplary embodiment of FIG. 1 to FIG. 10, but the shield layer may be disposed below a first conductive line of a connection wire disposed in a peripheral area PA according to another exemplary embodiment.

Hereinafter, a display device according to still another exemplary embodiment will be described in detail with reference to FIG. 12.

Figure 12:
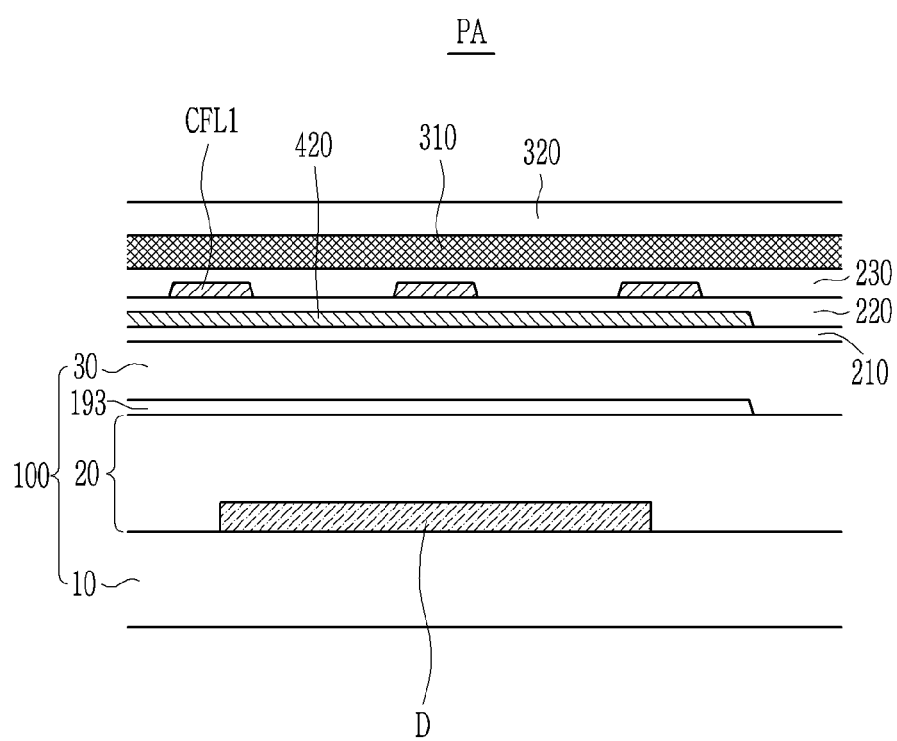
FIG. 12 is a cross-sectional view of a display device according to still another exemplary embodiment, wherein a portion P5 of FIG. 1 is cut.

FIG. 12 is a cross-sectional view of a display device according to another exemplary embodiment, wherein a portion P5 of FIG. 1 is cut.

The exemplary embodiment shown in FIG. 12 is substantially the same as the exemplary embodiment of FIG. 1 to FIG. 10, except for a peripheral shield layer, and therefore a duplicated description will be omitted.

First, as shown in FIG. 1, connection wires 247 and 248 that are connected with sense electrodes 241 and 242 of a display area DA may be disposed in a peripheral area PA of the display device according to another exemplary embodiment. Such connection wires 247 and 248 may include a plurality of first conductive lines CFL1.

As shown in FIG. 12, a switch 20 is disposed on a substrate 10 in a peripheral area PA of a display panel 100, and a second electrode 193 is disposed on the switch 20. In addition, a thin film encapsulation layer 30 covers the second electrode 193. The switch 20 may include a driver D that is disposed in the peripheral area PA.

A first insulation layer 210 is disposed on the thin film encapsulation layer 30, and a peripheral shield layer 420 is disposed on the first insulation layer 210. In addition, the peripheral shield layer 420 is covered by a second insulation layer 220, and first conductive lines CFL1 that form the connection wires 247 and 248 are disposed on the second insulation layer 220.

The peripheral shield layer 420 is integrally formed such that it may be disposed under the first conductive lines CFL1 and the second insulation layer 220 between neighboring first conductive lines CFL1. Thus, the peripheral shield layer 420 can block noise generated from a driver D during driving of the display panel 100 together with the second electrode 193 so that noise can be minimized.

In addition, since the peripheral shield layer 420 is disposed on the thin film encapsulation layer 30, the thickness of the thin film encapsulation layer 30 does not need to be increased to block noise so that manufacturing time and manufacturing cost can be saved. Further, lifting of the thin film encapsulation layer 30 due to a large thickness can be prevented.

In addition, since the peripheral shield layer 420 blocks noise, the first conductive lines CFL1 may not need to be disposed on the second electrode 193 for blocking of noise. Accordingly, resistance of the connection wire can be reduced by increasing the width of the first conductive line CFL1.

In FIG. 12, only a red color filter R and a green color filter G are illustrated for better understanding and ease of description, but this is not restrictive, and various modifications are applicable.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
    a display panel configured to display an image; and
    a touch sensor disposed on the display panel,
    the touch sensor comprising:
        a shield layer that is disposed on the display panel; and
        a plurality of sense electrodes that are disposed on the shield layer and partially overlapping the shield layer,
    wherein the plurality of sense electrodes comprises a first sense electrode and a second sense electrode,
    the first sense electrode comprises a plurality of first sense cells and plurality of first connection portions,
    the second sense electrode comprises a plurality of second sense cells and the plurality of second connection portions,
    the first sense cells, the second sense cells, and the second connection portions are disposed on a first layer,
    the first connection portions and the shield layer are disposed on a second layer different from the first layer, and
    the shield layer is made of the same material as that of the first connection portions and is not overlapped with the first connection portions.

2. The display device of claim 1, wherein the first sense electrodes comprises a plurality of conductive lines comprising a first conductive line and a second conductive line that are disposed on different layers, and
    the first conductive line is provided on the second conductive line, and the first conductive line overlaps the shield layer.

3. The display device of claim 2, wherein the touch sensor further comprises:
    a first insulation layer that is provided on the display panel and
    a second insulation layer that is provided on the first insulation layer;
    the second conductive line and the shield layer are disposed between the first insulation layer and the second insulation layer; and
    the first conductive line is disposed on the second insulation layer.

4. The display device of claim 3, wherein the second insulation layer comprises an organic material.

5. The display device of claim 2, further comprising a light blocking layer that is disposed on the touch sensor,
    wherein the light blocking layer overlaps the shield layer.

6. The display device of claim 5, wherein the display panel comprises:
    a substrate;
    a light emitting member disposed on the substrate; and
    a thin film encapsulation layer that covers the light emitting member, the light emitting member comprising:
        a plurality of organic light emitting diodes; and
        a pixel defining layer disposed on between the organic light emitting diodes,
    wherein the shield layer overlaps the pixel defining layer.

7. The display device of claim 6, wherein the light blocking layer overlaps the pixel defining layer.

8. The display device of claim 6, wherein the plurality of conductive lines are connected through contact holes with each other and have a mesh shape.

9. The display device of claim 8, wherein the shield layer corresponds to the first conductive line on a plane and has a mesh shape.

10. The display device of claim 9, wherein a width of the shield layer is greater than that of the first conductive line and smaller than that of the light blocking layer.

11. The display device of claim 8, wherein the shield layer is not overlapped with each pixel.

12. The display device of claim 3, wherein the display panel comprises a display area and a peripheral area that is provided outside the display area,
    the touch sensor further comprises connection wires that are connected with the sense electrode and disposed in the peripheral area, and
    the display device further comprises a peripheral shield layer that is provided between the connection wire and the display panel.

13. The display device of claim 12, wherein the connection wire comprises the first conductive line in plural, and the peripheral shield layer is disposed between the first insulation layer and the second insulation layer.

14. The display device of claim 13, wherein the peripheral shield layer is disposed below the first conductive lines and a second insulation layer between neighboring first conductive lines.

15. A display device comprising:
    a display panel configured to display an image; and
    a touch sensor disposed on the display panel,
    the touch sensor comprising:
        a plurality of sense electrodes that senses a touch; and
        a shield layer that is disposed between the sense electrode and the display panel,
    wherein the plurality of sense electrodes comprises a first sense electrode and a second sense electrode, the first sense electrode comprises a plurality of first sense cells and plurality of first connection portions, the second sense electrode comprises a plurality of second sense cells and a plurality of second connection portions, the first sense cells, the second sense cells, and the second connection portions are disposed on a first layer, the first connection portions and the shield layer are disposed on a second layer different from the first layer, and the shield layer is made of the same material as that of the first connection portions and is not overlapped with the first connection portions.

16. The display device of claim 15, wherein the first sense electrode extends in a first direction and the second sense electrode extends in a second direction which substantially perpendicularly crosses the first direction, and the shield layer is disposed on the same layer as the first connection portion.

17. The display device of claim 16, wherein the first sensing cell and the first connection portion are disposed on different layers respectively.

18. The display device of claim 17, wherein at least two adjacent first sense cells are connected to a same first connection portion through different contact holes respectively.

* * * * *